US 7,830,165 B2

(12) United States Patent
Chu et al.

(10) Patent No.: US 7,830,165 B2
(45) Date of Patent: Nov. 9, 2010

(54) SYSTEM AND METHOD FOR DETECTING SINGLE EVENT LATCHUP IN INTEGRATED CIRCUITS

(75) Inventors: Tan Van Chu, San Jose, CA (US); Ken-Chuen Mui, Portland, OR (US)

(73) Assignee: Integrated Device Technology, Inc., San Jose, CA (US)

( * ) Notice: Subject to any disclaimer, the term of this patent is extended or adjusted under 35 U.S.C. 154(b) by 164 days.

(21) Appl. No.: 11/394,784

(22) Filed: Mar. 31, 2006

(65) Prior Publication Data

US 2007/0229096 A1     Oct. 4, 2007

(51) Int. Cl.
G01R 31/26 (2006.01)
G01R 31/302 (2006.01)

(52) U.S. Cl. ..................... 324/765; 324/752
(58) Field of Classification Search ............... None
See application file for complete search history.

(56) References Cited

U.S. PATENT DOCUMENTS

| | | | | | |
|---|---|---|---|---|---|
| 5,153,503 | A | * | 10/1992 | Yahata | 324/765 |
| 5,491,662 | A | * | 2/1996 | Pezzini | 365/189.03 |
| 5,841,293 | A | * | 11/1998 | Leas | 324/765 |
| 5,892,224 | A | * | 4/1999 | Nakasuji | 250/310 |
| 6,346,821 | B1 | * | 2/2002 | Baumgart | 324/766 |
| 6,633,173 | B1 | * | 10/2003 | Orban | 324/750 |
| 6,636,067 | B1 | * | 10/2003 | Salcedo-Suner | 324/765 |
| 6,639,217 | B1 | * | 10/2003 | Li | 250/288 |
| 6,985,002 | B2 | * | 1/2006 | Salcedo | 324/765 |
| 7,019,511 | B1 | * | 3/2006 | Birdsley et al. | 324/96 |
| 7,126,681 | B1 | * | 10/2006 | Chen et al. | 356/237.4 |
| 7,248,062 | B1 | * | 7/2007 | Samsavar et al. | 324/750 |
| 7,474,011 | B2 | | 1/2009 | Lien et al. | |
| 2002/0125905 | A1 | * | 9/2002 | Borden et al. | 324/765 |
| 2008/0122473 | A1 | | 5/2008 | Lien et al. | |

OTHER PUBLICATIONS

Office Action mailed May 7, 2008, in related U.S. Appl. No. 11/527,374.
Amendment and Response to Office Action filed Jul. 1, 2008, in related U.S. Appl. No. 11/527,374.
Notice of Allowance dated Sep. 2, 2008, in related U.S. Appl. No. 11/527,374.

* cited by examiner

Primary Examiner—Roberto Velez
(74) Attorney, Agent, or Firm—Hayes Boone LLP

(57) ABSTRACT

A method for testing an integrated circuit for potential latchup sites includes applying a voltage to the integrated circuit, measuring a current through the integrated circuit, applying at least one radiation beam to at least one area of the integrated circuit, and detecting an occurrence of a latchup by detecting an increase of the current through the integrated circuit upon applying the at least one radiation beam to the at least one area of the integrated circuit.

30 Claims, 3 Drawing Sheets

SYSTEM AND METHOD FOR DETECTING SINGLE EVENT LATCHUP IN INTEGRATED CIRCUITS

FIELD OF THE INVENTION

The present invention is related to detection of potential single event latchup (SEL) sites in integrated circuits and, in particular, to detecting and identifying single event latchup sites in integrated circuits using a radiation source.

BACKGROUND OF THE INVENTION

A latchup is an inadvertent creation of a low-impedance path in an integrated circuit as a result of triggering a parasitic device in the integrated circuit. Latchup may happen anywhere in the integrated circuit where a parasitic structure (which is a structure that is inadvertently formed by placement of two or more devices in close proximity, such as a parasitic PNPN structure, which forms a silicon-controlled rectifier (SCR)) exists. A single event latchup (SEL) may be caused by a number of triggering factors, such as cosmic rays, spikes of voltage on an input or output terminal of the integrated circuit, other event. If an SEL occurs in the integrated circuit, excessive current may flow through the created low-impedance path, and the circuit in which the SEL has occurred may be destroyed by the excessive current. CMOS devices have inherent parasitic PNPN structures that are formed during fabrication of transistors in a semiconductor substrate. While technology is trending toward the development of smaller and higher performance integrated circuits, CMOS devices become more susceptible to SELs.

Testing for potential SEL sites is typically accomplished by scanning the circuit with neutron beams at an integrated repair operations center (IROC). At IROC, the circuit to be tested is placed under neutron beams and SELs are determined by counting the number of upsets that occurred in the entire integrated circuit. The testing only can indicate whether an SEL occurred, but cannot detect where the SEL occurred in the circuit, unless the circuit was functionally tested simultaneously under the neutron beam using a test program. In addition, the operator needs to know the layout of the circuit in order to find out the origin of the SEL. Moreover, the testing at IROC is costly, time consuming, requires waiting for one of the periods when the facility is available for such testing (about twice a year), and requires significant preparation with regard to boards, hardware, and programming.

Therefore, there is a need for better devices and methods that can test whether there is a potentiality that an SEL may occur in the circuit, and determine the potential origins of SELs in the circuits.

SUMMARY

In accordance with the present invention, the present disclosure is directed to a method for testing an integrated circuit for potential latchup sites. In some embodiments, the method includes applying a voltage to the integrated circuit, measuring a current through the integrated circuit, applying radiation to at least one area of the integrated circuit, and detecting an occurrence of a latchup. Detecting an occurrence of a latchup can include detecting a change in the current through the integrated circuit upon applying the radiation to the at least one area of the integrated circuit.

In another aspect, the present disclosure is directed to a system for testing an integrated circuit for potential latchup sites. In some embodiments, the system can include a radiation source adapted to generate and apply radiation to at least one area of the integrated circuit, a power supply adapted to apply a voltage to the integrated circuit, and a current measuring device adapted to measure a current passing through the integrated circuit, the current measuring device detecting whether a latchup occurs upon applying the laser energy to the at least one area of the integrated circuit by detecting an increase in measured current through the integrated circuit.

It is to be understood that both the foregoing general description and the following detailed description are exemplary and explanatory only and are not restrictive to the invention, as claimed. These and other embodiments are further discussed below with reference to the accompanying drawings, which are incorporated in and constitute a part of this specification.

DETAILED DESCRIPTION

Figure 1:
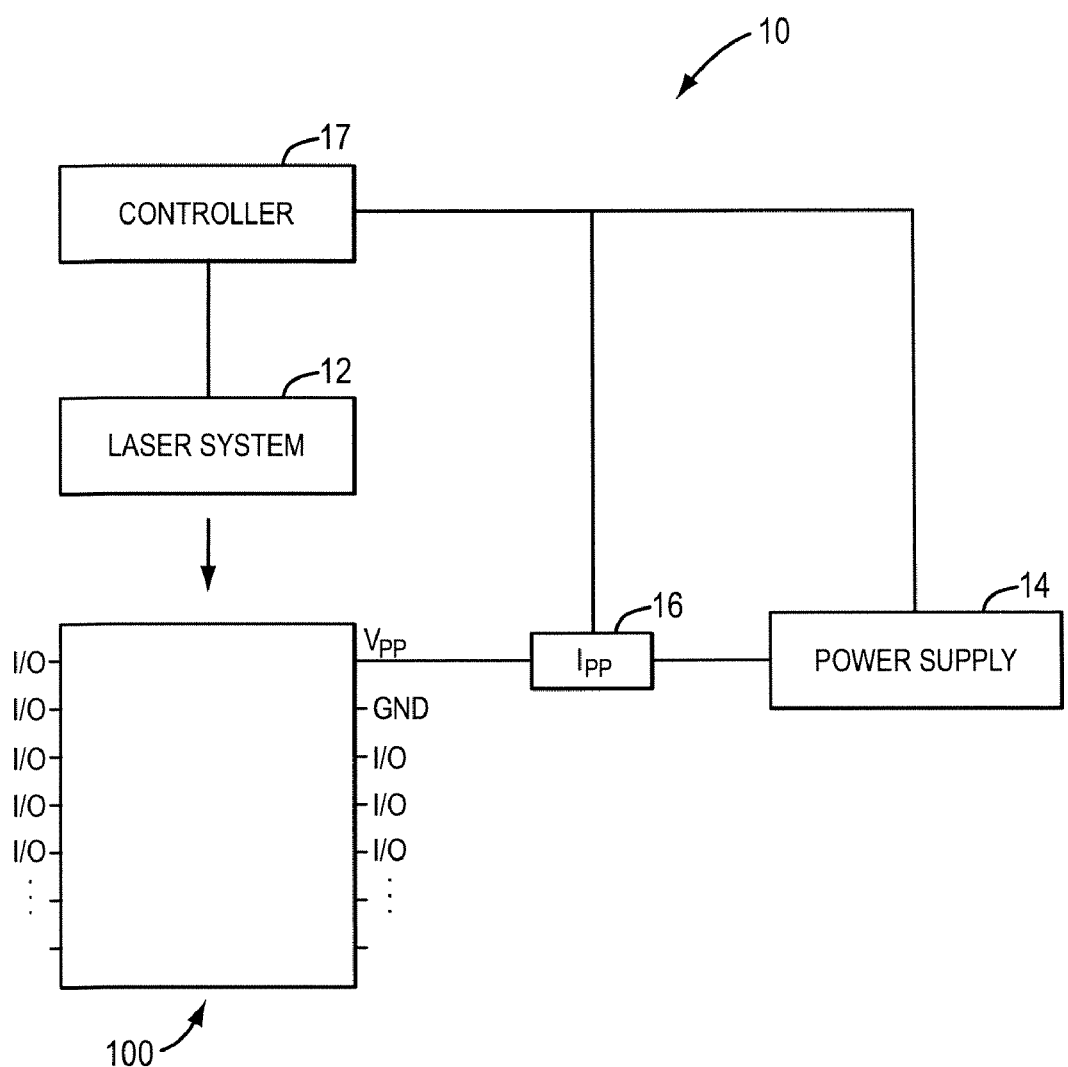
FIG. 1 illustrates a schematic diagram of a system for testing an integrated circuit for potential latchup sites together with an integrated circuit to be tested according to one embodiment of the present disclosure.

The present disclosure is directed to a system and method for testing an integrated circuit device for potential SEL sites. FIG. 1 shows a schematic diagram of an SEL testing system 10 according to some embodiments of the present invention for testing an integrated circuit 100. As shown in FIG. 1, system 10 includes a radiation source 12 adapted to apply one or more beams of radiation to at least one area of integrated circuit 100, a power supply 14 adapted to apply a voltage to integrated circuit 100, and a current measuring device 16 adapted to measure a current passing through integrated circuit 100.

In some embodiments, radiation source 12 can generate one or more laser beams, which can be used to scan at least one area of integrated circuit 100. In some embodiments, radiation source 12 produces beams of radiation that can be raster scanned over an area of integrated circuit 100. In some embodiments, radiation source 12 can generate pulsed laser beams (laser shots) and use the pulsed laser beams to scan through at least one area of integrated circuit 100. In some embodiments, radiation source 12 can produced pulsed radiation beams for rastering over integrated circuit 100. The spot size of the radiation beam on integrated circuit 100 may be adjusted based on testing requirements. For example, to perform a low-resolution test, an operator may use a relatively larger spot size and move the large spot size laser beam quickly over the testing area on integrated circuit 100. To perform a high-resolution test, an operator may use a relatively smaller spot size and move the small spot size laser beam slowly over the testing area on integrated circuit 100. In some embodiments, the pulse frequency of the pulsed laser can be any frequency, for example in the range of about 1 Hz to about 20 Hz. The energy generated by radiation source 12 and applied to integrated circuit 100 is high enough to induce ionization in the integrated circuit that may alter charge stored at nodes or current flows in the circuit. In a latchup sensitive site, for example, a PNPN path, if a sufficient charge is deposited at the nodes, the PNPN path may be triggered into its high conductance state. In some examples, sufficient charge may be removed from a particular node to switch a parasitic circuit to a high conductance state or from a high conductance state to a low conductance state. A change in the conductance state of a parasitic circuit can result in a latch up event.

In some embodiments, radiation source 12 can produce radiation beams of any energy, for example pulsed laser beams in the energy range of about 0.01 mJ to about 0.05 mJ. Radiation source 12 can produce radiation beams of any wavelength, for example laser beams of wavelengths between about 350 nm to about 1060 nm, for example a 532 nm beam. The wavelength of the incident radiation determines the penetration depth of the radiation into integrated circuit 100 while the power of the incident radiation is related to the number of charges generated per unit time in the semiconductor material. In some embodiments, the power of the radiation beam is insufficient to damage integrated circuit 100.

Radiation source 12 can include, for example, laser sources, other optical sources (e.g., UV or optical lamps), and x-ray sources. Radiation source 12 can also include beam steerage and focusing components, such as, for example, mirrors, lenses, positioners, and other components. In some embodiments multiple radiation beams, operating at any combination of wavelengths, from radiation source 12 can be incident on integrated circuit 100. In some embodiments, the multiple beams can be incident on the same spot of integrated circuit 100. In some embodiments, the multiple beams can be scanned separately or in specific inter-related patterns over the surface of integrated circuit 100. In some embodiments, radiation source 12 produces a single beam of radiation (e.g. a laser beam) that can be scanned over the surface of integrated circuit 100.

As shown in FIG. 1, a controller 17 can be coupled to radiation source 12 to control the location of the beams of radiation incident on integrated circuit 100. Controller 17 can also be coupled to current measuring device 16 and, in some embodiments, to power supply 14 to determine if there has been a change in current sufficient to indicate a possible SEL event.

Figure 2:
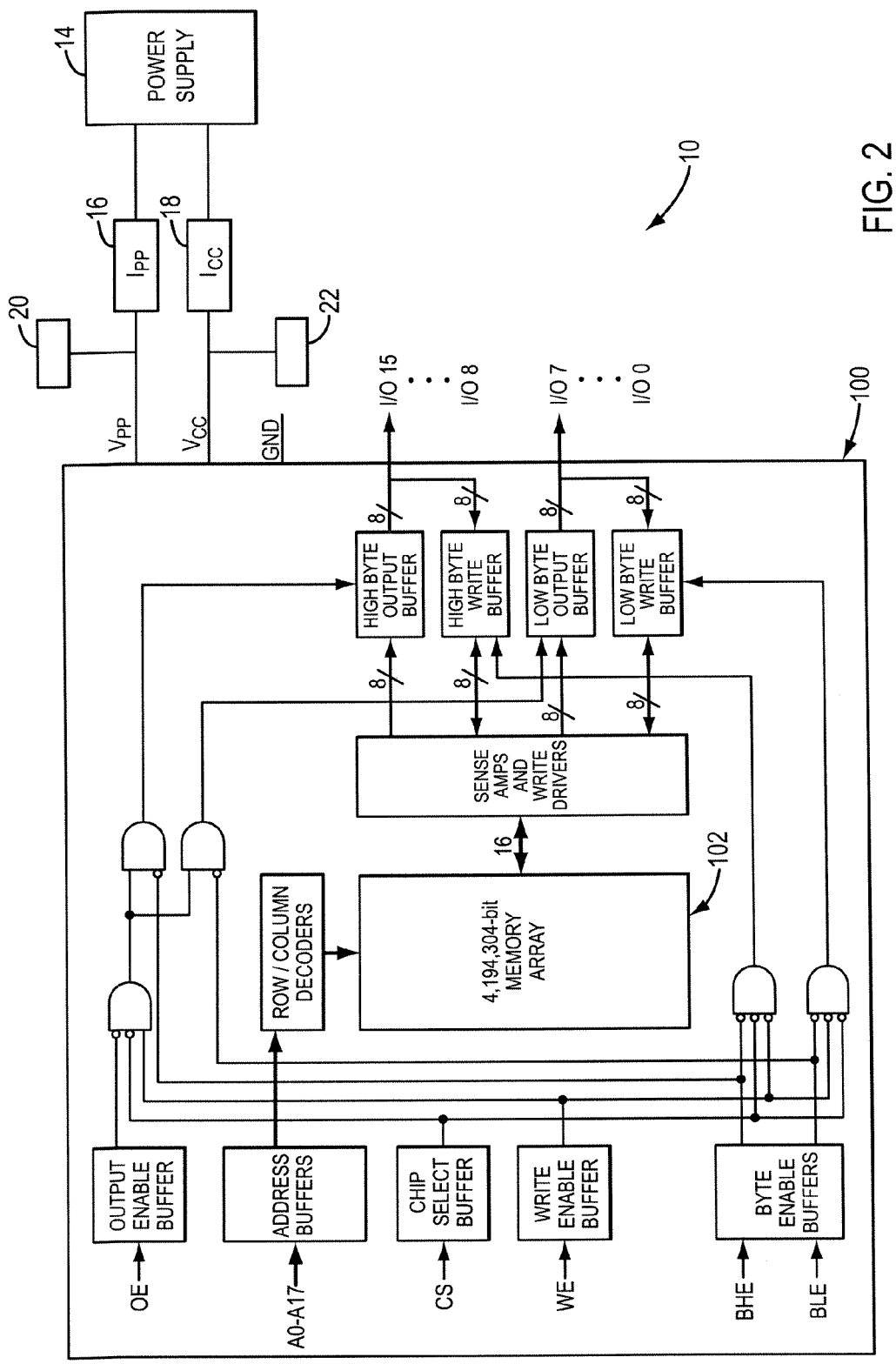
FIG. 2 illustrates a diagram of an exemplary integrated circuit to be tested and a system for testing the integrated circuit for potential latchup sites according to some embodiments of the present disclosure.

FIG. 2 schematically shows a functional block diagram of an exemplary integrated circuit 100 to be tested. Integrated circuit 100 that is shown in FIG. 2 is a CMOS static RAM (SRAM). One skilled in the art should recognize that SEL testing system 10 according to the present disclosure can be used on any integrated circuits that may suffer SELs, and is not limited to memory devices. As shown in FIG. 2, integrated circuit 100 has a power supply pin Vcc and a programming voltage supply pin Vpp. Vcc is used to supply power to integrated circuit 100, and Vpp is used to supply programming voltage to integrated circuit 100 during programming. In an SEL testing, Vcc and Vpp may both be connected to the external power supply 14.

Current measuring device 16 is coupled to Vpp to measure the current Ipp flowing into or out of Vpp. SEL testing system 10 may further include a current measuring device 18, which is coupled to Vcc to measure the current Icc flowing into or out of Vcc. System 10 may further include voltage measuring devices 20 and 22 for measuring the voltages at Vpp and Vcc. The voltage measuring devices 20 and 22 may have one terminal respectively coupled to the Vpp pin and Vcc pin, and the other terminal (not shown in FIG. 2) coupled to the ground.

In an experimental testing, before applying laser energy to integrated circuit 100, the currents Icc and Ipp and voltages at Vcc and Vpp are measured, and the results are shown in Table 1.

TABLE 1

| Operation Mode | Vcc (V) | Icc (ma) | Vpp (V) | Ipp (ma) | Comments |
|---|---|---|---|---|---|
| Standby | 3 v | 1.1 ma | 3 v | 3 ma | None |
| Standby | 3 v | 1.1 ma | 1.8 v | 1.58 ma | None |
| Reading Data | 3 v | N.M | 1.8 v | 8 ma | None |

Radiation energy is then applied to an area to be tested, for example, the memory array 102 in FIG. 2, on integrated circuit 100 or the whole chip. In some embodiments, radiation source 12 generates a continuous laser beam. In some embodiments, radiation source 12 generates a pulsed laser beam. The radiation beam or beams generated by radiation source 12 can be used to scan through the area or be focused on small spots or a small area on integrated circuit 100.

In some cases, the radiation induces carriers or charges that can accumulate at some of the nodes in integrated circuit 100. When the charge accumulation exceeds a threshold value at potential SEL sites, an SEL may occur. As a result of the excess charge, a low impedance path is created at the node, causing an SEL event, which, in turn, causes the current flow through current measuring device 18 to increase.

In some cases, charges at a particular node may be released by the incident radiation. Reduction of the charge at a node also can trigger an electrical change at the node that can result in an SEL event.

In some embodiments, system 10 allows particular sensitive nodes or areas on integrated circuit 100 to be pinpointed and individually tested by the radiation beams, and thus, potential latchup sites can be precisely located by recording the location of the radiation beam on integrated circuit 100 when SELs are induced. Any systems that can precisely position the radiation beam or integrated circuit 100, and thereby determine and record the location of the radiation beam incident on integrated circuit 100 can be used. In some embodiments, radiation source 12 may have a controller that uses a coordinate system to record the location of the laser. The controller of radiation source 12 can be in communication with controller 17.

Figure 3:
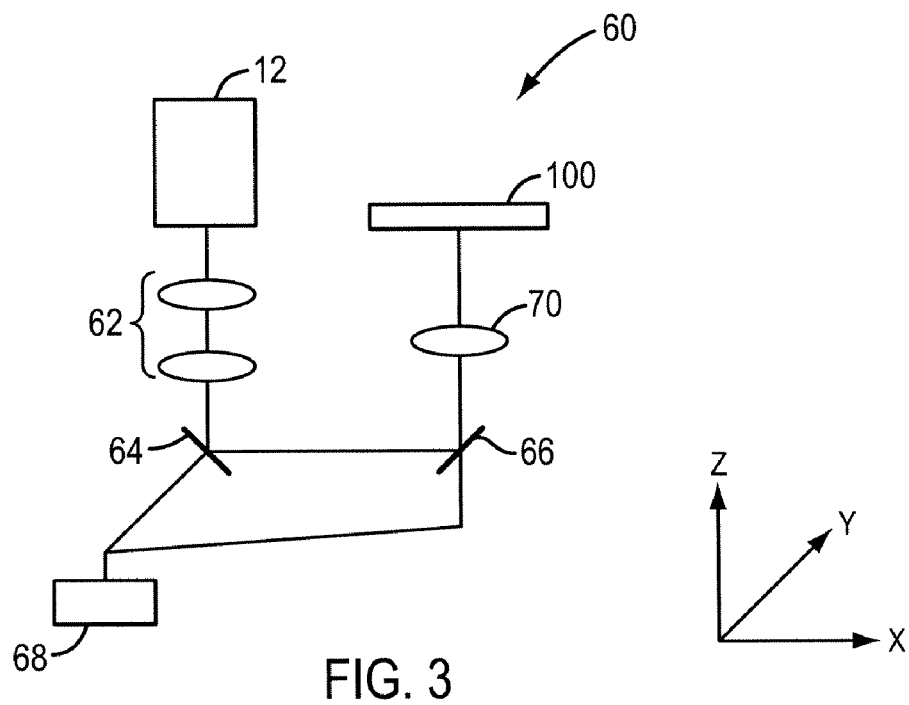
FIG. 3 illustrates an exemplary positioning system for positioning a laser beam on an integrated circuit according to some embodiments of the present disclosure.

FIG. 3 shows one exemplary positioning system 60 of radiation source 12. Position system 60 positions the laser beam incident on integrated circuit 100. As shown in FIG. 3, positioning system 60 may include one or more collimators 62 for collimating the laser beam from radiation source 12. Positioning system 60 may further include an X-coordinate raster 64 and a Y-coordinate raster 66 for positioning the laser beam precisely in X-coordinate location and Y-coordinate location on integrated circuit 100. X-coordinate raster 64 and Y-coordinate raster 66 are controlled by a controller 68. Positioning system 60 may further include a focus lens 70 for further focusing the laser beam on integrated circuit 100. The focus lens 70 may also be used to control the spot size of the laser beam incident on integrated circuit 100. Controller 68 can record the location of the laser beam relative to integrated circuit 100 when an induced latchup occurred in integrated circuit 100.

Figure 4:
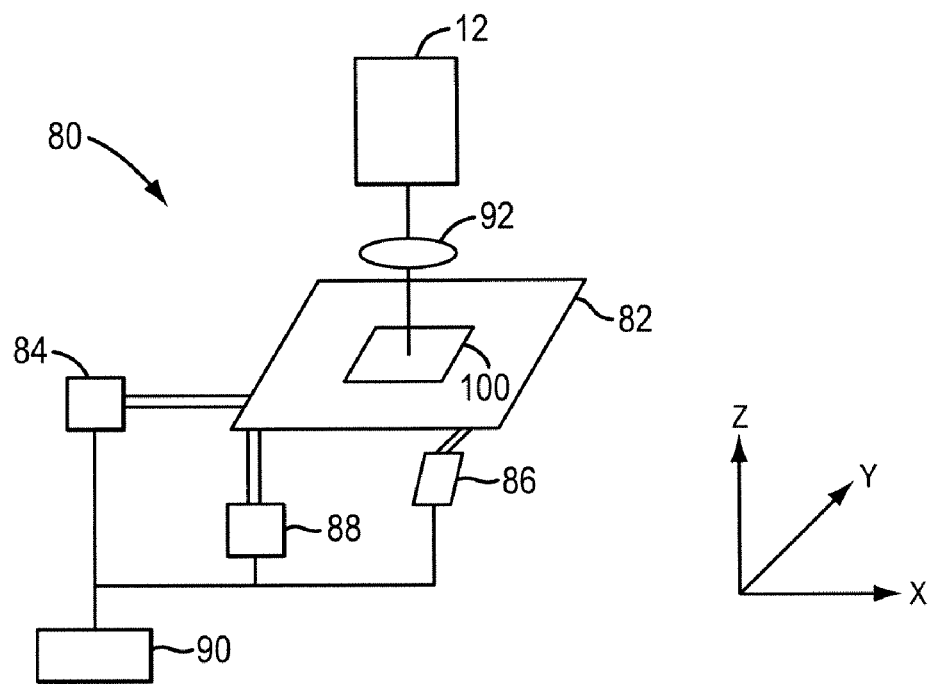
FIG. 4 illustrates another exemplary positioning system for positioning a laser beam on an integrated circuit according to some embodiments of the present disclosure.

FIG. 4 shows another exemplary positioning system 80 for positioning a laser beam on integrated circuit 100. Positioning system 80 includes a movable carrier 82, and an X-coordinate actuator 84, a Y-coordinate actuator 86, and a Z-coordinate actuator 88 for moving carrier 82 in X, Y, and Z directions. Actuators 84, 86, and 88 are controlled by a controller 90. In use, integrated circuit 100 can be placed on movable carrier 82, so that positioning system 80 can precisely position integrated circuit 100 relatively to the laser beam from laser system 12. Controller 90 can record the location of the integrated circuit 100 relative to the laser beam when an induced latchup occurred in integrated circuit 100. Positioning system 80 may include a collimator 92 placed between laser system 12 and integrated circuit 100 for collimating the laser beam on integrated circuit 100. The collimator 92 may also be used to control the spot size of the laser beam on integrated circuit 100.

Current measuring device 16 measures the current Ipp flowing into or out of Vpp. When an SEL is actually induced by the laser beam, a part of the circuit at the location of the SEL is short-circuited, and the current through that part of the circuit suddenly changes. The current Ipp can also change. A threshold increase or decrease in the current, indicating an occurrence of a latchup, may be experimentally set. If the measured current increases over a threshold value or decrease below a threshold value, indicating that an induced latchup has occurred, the location of the laser beam or pulsed laser can be recorded by controller 17 as a latchup site. If an induced latchup occurs, a redesign of the circuitry may be arranged.

In an experimental test performed on integrated circuit 100 as shown in FIG. 2, the currents Icc and Ipp and voltages at Vcc and Vpp are measured while laser energy is applied to at least an area of integrated circuit 100. The measurement results are shown in Table 2. As seen in Table 2, compared to the data in Table 1, Ipp increased in three events, which indicates that SELs have occurred in three locations. Locations of those SELs can be determined by examining the location of the laser beam at the time the SELs occurred.

TABLE 2

| Operation Mode | Vcc (V) | Icc (ma) | Vpp (V) | Ipp (ma) | Comments |
| --- | --- | --- | --- | --- | --- |
| Standby | 3 v | 1.1 ma | 2.4 v | 266 ma | Latchup occurred |
| Standby | 3 v | 1.1 ma | 1.75 v | 130 ma | Latchup occurred |
| Read-CK continuous | 3 v | N.M | 1.8 v | 133 ma | Latchup occurred |

In the above described embodiments, system 10 is used to test integrated circuit 100 for induced latchups and detect low impedance paths between the power supply pin and ground. System 10 also can be used to detect induced latchups between I/O pins and ground (GND), between I/O pins and the power supply pin, etc. In testing inducted latchups between I/O pins and ground or the power supply pin, a voltage may be applied to the I/O pins and the current flowing into or out of the I/O pins are monitored. An induced latchup can be detected by detecting changes in the current through the I/O pins upon applying the laser energy to an area of integrated circuit 100.

It will be apparent to those skilled in the art that various modifications and variations can be made to the system and method for testing an integrated circuit device for potential SEL sites. Other embodiments will be apparent to those skilled in the art from consideration of the specification and practice of the disclosed system and method for testing an integrated circuit device for potential SEL sites. It is intended that the specification and examples be considered as exemplary only, with a true scope being indicated by the following claims and their equivalents.

What is claimed is:

1. A method for testing an integrated circuit for potential latchup sites, comprising:
   applying a power supply voltage and a programming voltage to the integrated circuit;
   monitoring a power supply current and programming voltage current flowing through the integrated circuit;
   monitoring the power supply voltage and the programming voltage;
   applying a radiation beam to at least one area of the integrated circuit;
   scanning the radiation beam through the integrated circuit;
   adjusting a scanning resolution of the radiation beam on the integrated circuit by adjusting a spot size of the radiation on the integrated circuit;
   adjusting a moving speed of the radiation beam on the integrated circuit after adjusting the spot size of the radiation;
   detecting an occurrence of a latchup at the radiation spot by detecting a change in the programming voltage current through the integrated circuit upon applying the radiation beam; and
   recording a location of the radiation spot on the integrated circuit when the programming voltage current changes.

2. The method of claim 1, wherein applying radiation includes applying a laser beam.

3. The method of claim 2, wherein the radiation is electromagnetic radiation with a wavelength of between 350 nm and 1060 nm.

4. The method of claim 1, wherein applying radiation includes applying a plurality of radiation beams.

5. The method of claim 4, wherein each of the plurality of radiation beams scans separate areas of the integrated circuit.

6. The method of claim 1, wherein applying radiation to at least one area of the integrated circuit includes scanning the at least one area of the integrated circuit by moving a radiation beam point-by-point over the at least one area.

7. The method of claim 1, wherein applying radiation to at least one area of the integrated circuit includes applying a pulsed radiation beam to the at least one area the integrated circuit.

8. The method of claim 7, wherein the pulsed radiation beam is a pulsed laser beam with a pulse frequency of between 1 Hz and 20 Hz.

9. The method of claim 1, wherein applying radiation to at least one area of the integrated circuit includes pinpointing particular points on the integrated circuit with the radiation beam.

10. The method of claim 1, wherein the radiation is laser energy which is between 0.01 mJ and 0.05 mJ.

11. The method of claim 1, wherein the programming voltage is applied to the integrated circuit through a programming voltage supply pin of the integrated circuit.

12. The method of claim 11 further including applying the power supply voltage to the integrated circuit through a power supply pin of the integrated circuit.

13. The method of claim 12 further including measuring the power supply current through the power supply pin.

14. The method of claim 11, wherein the programming voltage current is measured through the programming voltage supply pin.

15. The method of claim 1, wherein detecting an occurrence of a latchup by detecting a change in the programming voltage current through the integrated circuit upon applying the radiation to the at least one area of the integrated circuit includes detecting an occurrence of a latchup by detecting an increase of the programming voltage current through the integrated circuit over a predefined threshold value upon applying the radiation to the at least one area of the integrated circuit.

16. A system for testing an integrated circuit for potential latchup sites, comprising:
- a radiation source configured to generate a radiation beam and scan through at least one area of the integrated circuit with the radiation beam, adjust a scanning resolution of the radiation beam on the integrated circuit by adjusting a spot size of the radiation beam on the integrated circuit, and adjusting a moving speed of the radiation beam on the integrated circuit:
- a power supply configured to apply a power supply voltage and a programming voltage to the integrated circuit; and
- voltage monitors configured to monitor the power supply voltage and the programming voltage applied to the integrated circuit;
- a current measuring device configured to measure a programming voltage current passing through the integrated circuit, the current measuring device detecting whether a latchup occurs at the radiation beam spot upon applying the radiation to the at least one area of the integrated circuit by detecting an increase in measured programming voltage current through the integrated circuit; and
- a controller that records a location of the radiation on the integrated circuit when the programming voltage current increases.

17. The system of claim 16, wherein the radiation source includes a laser source.

18. The system of claim 16, wherein the radiation source is configured to generate and apply a pulsed radiation beam to the at least one area of the integrated circuit.

19. The system of claim 18, wherein the pulsed radiation beam is a pulsed laser beam with a pulse frequency of between 1 Hz and 20 Hz.

20. The system of claim 19, wherein the pulsed laser beam has a pulsed energy of between 0.01 mJ and 0.05 mJ.

21. The system of claim 19, wherein the pulsed laser beam has a wavelength of between 350 nm and 1060 nm.

22. The system of claim 16, wherein the radiation source is configured to pinpoint particular points on the integrated circuit with a radiation beam.

23. The system of claim 16, wherein the current measuring device is configured to detect whether a latchup occurs upon applying the radiation to the at least one area of the integrated circuit by detecting a change in measured programming voltage current over a predefined threshold value through the integrated circuit.

24. A system for testing an integrated circuit for potential latchup sites, comprising: means for applying at least one radiation beam to at least one area of the integrated circuit, scanning the at least one area with the radiation beam, adjusting a scanning resolution by adjusting a spot size of the radiation beam on the integrated circuit, and adjusting a moving speed of the radiation beam on the integrated circuit; means for applying a power supply voltage and a programming voltage to the integrated circuit; means for monitoring the power supply voltage and the programming voltage applied to the integrated circuit; means for monitoring a programming voltage current through the integrated circuit, and detecting an occurrence of a latchup by detecting a change in the programming voltage current through the integrated circuit upon applying the at least one radiation beam to the at least one area of the integrated circuit; and means for recording a location of the radiation beam on integrated circuit when the programming voltage current changes.

25. The system of claim 24, wherein means for applying at least one radiation beam to at least one area of the integrated circuit includes means for generating a laser beam to scan the at least one area of the integrated circuit.

26. The system of claim 24, wherein means for applying at least one radiation beam to at least one area of the integrated circuit includes means for generating a pulsed laser and applying the pulsed laser to the at least one area the integrated circuit.

27. The system of claim 26, wherein the pulsed laser has a pulse frequency of between 1 Hz and 20 Hz.

28. The system of claim 24, wherein means for applying at least one radiation beam to at least one area of the integrated circuit includes means for pinpointing particular points on the integrated circuit with the at least one radiation beam.

29. The system of claim 24, wherein the at least one radiation beam has a wavelength of between 350 nm and 1060 nm.

30. The system of claim 24, wherein the at least one radiation beam has an energy of between 0.01 mJ and 0.05 mJ.

* * * * *